United States Patent [19]
Jansseune

[11] Patent Number: 5,554,964
[45] Date of Patent: Sep. 10, 1996

[54] MICROSWITCH WITH A MAGNETIC FIELD SENSOR

[75] Inventor: Luc Jansseune, München, Germany

[73] Assignee: Siemens Aktiengesellschaft, Munich, Germany

[21] Appl. No.: 398,055

[22] Filed: Mar. 2, 1995

Related U.S. Application Data

[63] Continuation of Ser. No. 89,664, Jul. 9, 1993, abandoned.

[30] Foreign Application Priority Data

Jul. 9, 1992 [DE] Germany ............................ 42 22 617.1
Nov. 10, 1992 [DE] Germany ............................ 42 37 928.8

[51] Int. Cl.⁶ .................................................. H01H 9/00
[52] U.S. Cl. ........................................... 335/207; 335/206
[58] Field of Search ........................................... 335/205–7

[56] References Cited

U.S. PATENT DOCUMENTS 3,226,631 12/1965 Kuhrt et al. .
5,128,641 7/1992 Posey ................................. 335/205

FOREIGN PATENT DOCUMENTS 4211486 4/1993 Germany .

*Primary Examiner*—Lincoln Donovan
*Attorney, Agent, or Firm*—Herbert L. Lerner; Laurence A. Greenberg

[57] ABSTRACT

A microswitch includes two coaxial columnar permanent magnets having poles of the same polarity facing one another or poles of different polarities facing one another, defining an air gap therebetween. The permanent magnets generate magnetic fields defining a boundary region. A magnetic field sensor, which may or may not be chip-like, is disposed in the boundary region and is fixedly disposed in the air gap, optionally in the axial direction in the air gap. A switch device is connected to the magnetic field sensor and has a switching status varying in accordance with magnetic induction at the magnetic field sensor.

17 Claims, 5 Drawing Sheets

5,554,964

MICROSWITCH WITH A MAGNETIC FIELD SENSOR

This application is a continuation of application Ser. No. 08/089,664, filed Jul. 9, 1993, now abandoned.

BACKGROUND OF THE INVENTION

1. Field of the Invention

The invention relates to a microswitch having a magnetic field or gauss sensor, a switch device varying its switching status in accordance with magnetic induction at the magnetic field sensor, and two permanent magnets generating magnetic fields having a boundary region in which the magnetic field sensor is disposed.

U.S. Pat. No. 3,226,631 already discloses a magnetic field switch in which two permanent magnets that are disposed with their axes parallel, are each joined by one pole of the same name or polarity through a yoke, while the other poles that are also of the same name or polarity as each other each have a pole piece, and free ends of the pole pieces form a gap in which a magnetic field sensor is disposed. If a ferromagnetic tripping body, such as an iron rail, is moved across the gap, that is detected and evaluated through the magnetic field sensor. However, the layout for a microswitch as shown therein is overly complicated and too large.

2. Summary of the Invention

It is accordingly an object of the invention to provide a microswitch with a magnetic field sensor, which overcomes the hereinafore-mentioned disadvantages of the heretofore-known devices of this general type, which is constructed simply, with as few and as small components as possible, and which enables reliable actuation without being vulnerable to undesirable extraneous influences.

With the foregoing and other objects in view there is provided, in accordance with the invention, a microswitch, comprising two coaxial columnar permanent magnets having poles of the same name or polarity facing one another defining an air gap therebetween, the permanent magnets generating magnetic fields defining a boundary region; a magnetic field sensor being disposed in the boundary region and fixedly disposed in the air gap; and a switch device being connected to the magnetic field sensor and having a switching status varying in accordance with magnetic induction at the magnetic field sensor.

With the objects of the invention in view, there is also provided a microswitch, comprising two coaxial columnar permanent magnets having poles of different names or polarities facing one another defining an air gap therebetween, the permanent magnets generating magnetic fields defining a boundary region; a chip-like magnetic field sensor being disposed in the boundary region and fixedly disposed in the axial direction in the air gap; and a switch device being connected to the magnetic field sensor and having a switching status varying in accordance with magnetic induction at the magnetic field sensor.

Accordingly, in the switch of the invention the two permanent magnets are disposed directly one above the other, in such a way that they themselves form the air gap for the magnetic field sensor, making additional yokes or pole pieces unnecessary. Small, for instance round magnets may be used for the configuration, so that overall a switch of very small volume can be made.

In accordance with another feature of the invention, the two permanent magnets are disposed at a fixed distance from one another, and the magnetic field sensor in the air gap is likewise fixed in a fixed relationship with the two permanent magnets, in such a manner that the magnetic induction at the magnetic field sensor in the position of repose is adjusted to a fixed value, and upon approach of a ferromagnetic tripping body to a pole of one of the permanent magnets remote from the magnetic field sensor, or to one of the sides of one of the permanent magnets that are parallel to the axial direction, the magnetic inductance assumes a magnitude that is varied as compared with the position of repose and can be evaluated by the switch device.

The configuration of the magnetic field sensor is thus separate from the switching range for the tripping body at one of the outer permanent magnet poles. Once again, this permits an especially simple layout of the switch.

In accordance with a further feature of the invention, a first one of the two permanent magnets is fixed in a fixed association together with the magnetic field sensor, a second one of the two permanent magnets is guided displaceably in the axial direction and is biased by a restoring force into a position of repose remote from the magnetic field sensor, in the position of repose a magnetic induction that is effective at the magnetic field sensor can be evaluated, and upon displacement of the second permanent magnet counter to the restoring force into a working position, the measured induction at the magnetic field sensor is decreased by an evaluatable amount.

In accordance with an added feature of the invention, the magnetic repulsion between the two permanent magnets is used as the restoring force. This provides an especially simple construction.

In accordance with an additional feature of the invention, the second permanent magnet is connected to an actuation tappet of non-ferromagnetic material that is axially guided in a housing.

In accordance with yet another feature of the invention, the magnetic field sensor is a Hall sensor or a magnetoresistor (field plate), depending on the conditions of use. Other magnetic field-sensitive elements, such as magnetic field diodes and the like, are also conceivable.

In accordance with a concomitant feature of the invention, there are provided terminals of the switch being constructed as insulation displacement connection terminals.

Other features which are considered as characteristic for the invention are set forth in the appended claims.

Although the invention is illustrated and described herein as embodied in a microswitch with a magnetic field sensor, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawing.

DESCRIPTION OF THE PREFERRED EMBODIMENTS

Figure 1:
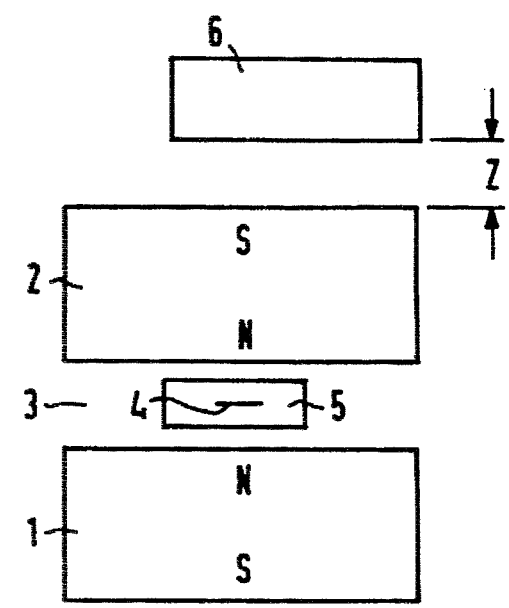
FIG. 1 is a diagrammatic, elevational view of a basic layout of an embodiment of a microswitch according to the invention, with two permanent magnets, one magnetic field circuit, and a tripping body.

Referring now to the figures of the drawing in detail and first, particularly, to FIG. 1 thereof, there is seen a diagrammatic view of a configuration of a microswitch with a magnetic field effect. Two permanent magnets 1 and 2, which by way of example may be cylindrical or block-shaped, are disposed one above the other coaxially with opposite polarization directions, so that poles of the same name or polarity, in this example the north poles N, face one another. Between the two permanent magnets 1 and 2, an air gap 3 is formed in which a magnetic field sensor 4 is disposed, as part of a magnetic field chip 5 containing an evaluation circuit. The magnetic field sensor 4 is located precisely, or at least approximately, in the neutral zone between the two permanent magnets. The fluxes from the poles of the same name or polarity of the two magnets repel one another, so that the magnetic field sensor does not experience any magnetic field induction.

However, if a ferromagnetic tripping body 6 is made to approach the outer poles, in this example one of the south poles S, then the equilibrium between the magnetic fields is disturbed. A measurable magnetic induction occurs at the magnetic field sensor, which is used to switch over the evaluation circuit contained in the magnetic field chip 5.

Figure 4:
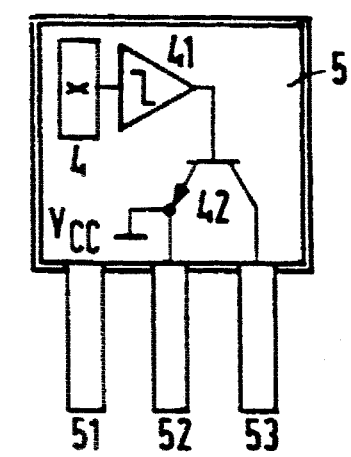
FIG. 4 is a diagrammatic and schematic view of an integrated circuit with a magnetic field sensor and an evaluation circuit.

An integrated circuit in the form of a magnetic field chip 5 with a magnetic field sensor 4, a threshold value circuit (Schmitt trigger) 41, and a semiconductor switch 42, is shown by way of example in FIG. 4. The elements 41 and 42 form a switch device. Magnetic field sensors of this kind are available on the market. The chip 5 that is shown as a rule has three terminal lugs, namely a supply terminal 51, a ground terminal 52 and a signal output terminal 53.

Figure 2:
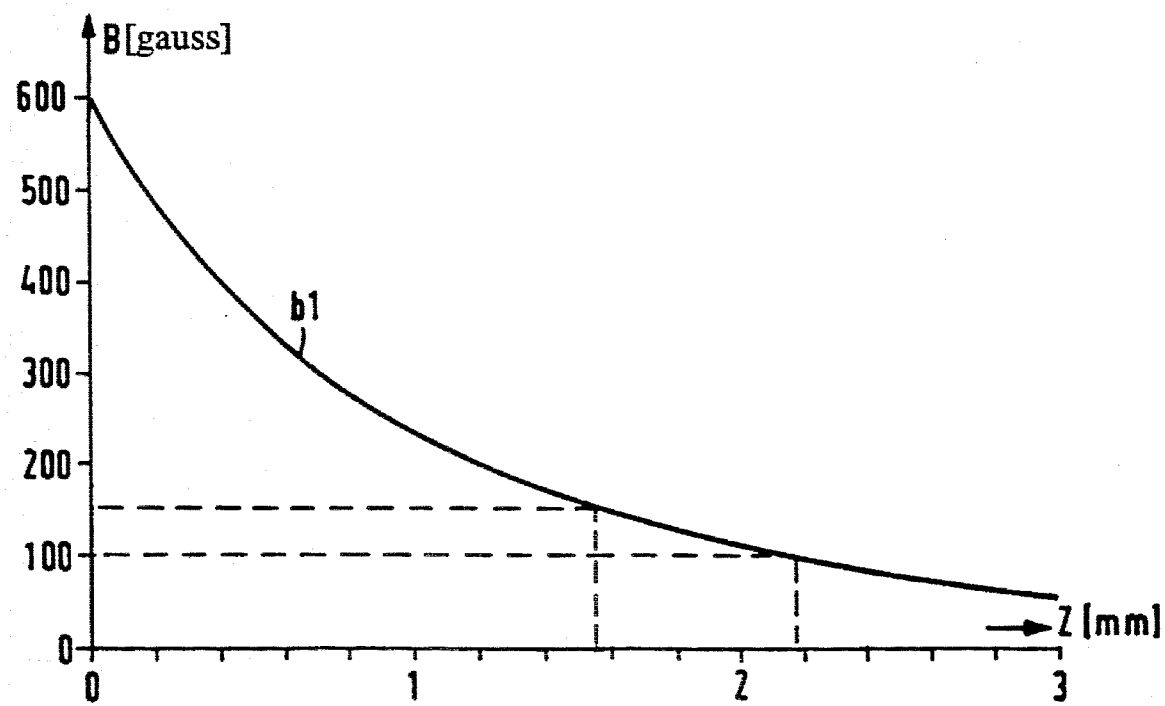
FIG. 2 is a diagram of a curve illustrating one exemplary course of magnetic induction at the magnetic field sensor, as a function of the distance of a tripping body, in accordance with FIG. 1.

FIG. 2, purely by way of example, shows a course b1 of magnetic induction at the magnetic field sensor 4 in FIG. 1 as a function of a distance z of the tripping body 6 from the permanent magnet 2. This shows that if the distance z is decreased, the magnetic induction B increases. In the example shown, the switching threshold of the Hall IC 5 is 150 G, corresponding to a distance z of approximately 1.5 mm. Conversely, a turn-off threshold, because of the hysteresis in the threshold value switch 41, is approximately 100 G, corresponding to a distance z of approximately 2.2 mm. These are purely numerical examples for a very specific exemplary embodiment. Depending on the characteristic values of the Hall IC being used and on the other components, these threshold values will naturally also vary.

Figure 3:
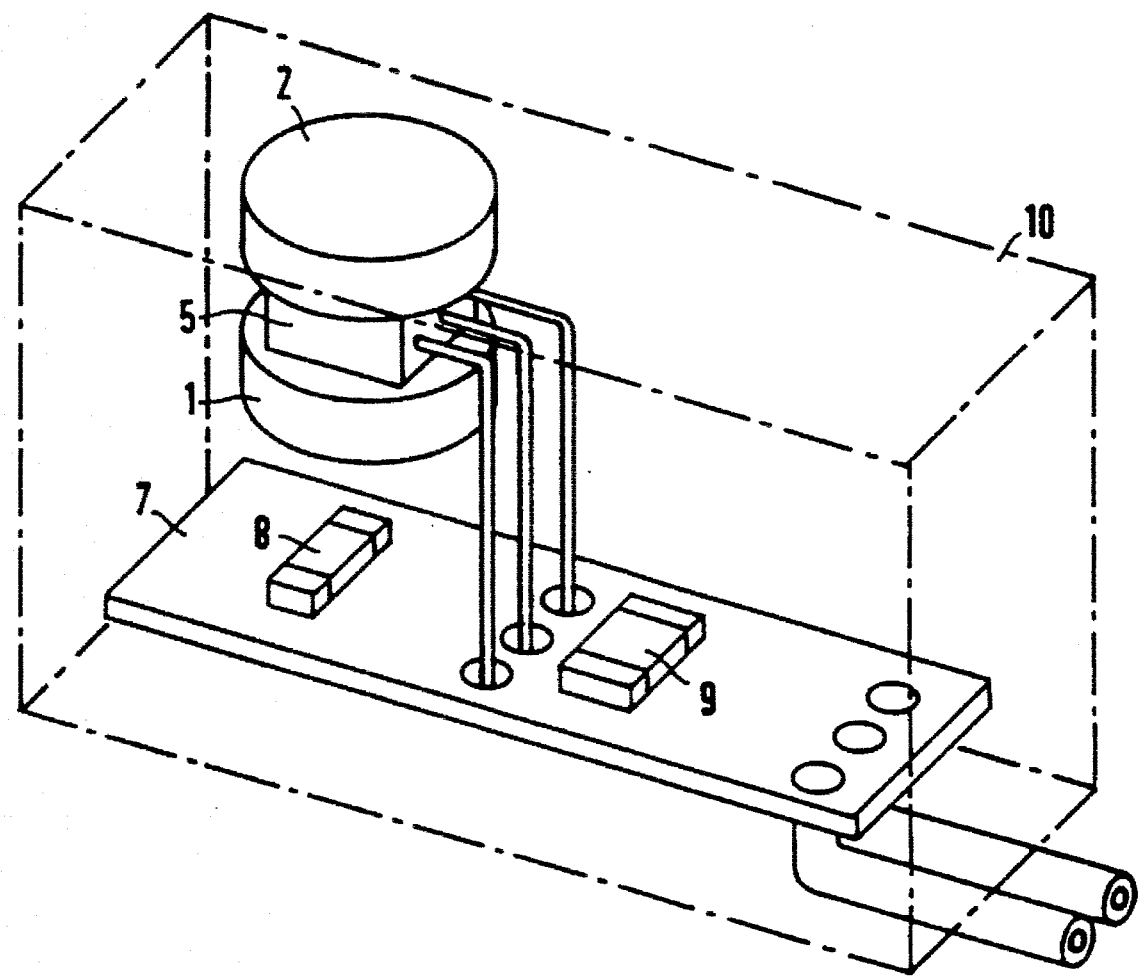
FIG. 3 is a perspective view of the structural layout of a microswitch with a magnetic field sensor in a housing.

FIG. 3 shows one possible structural layout for a switch according to the invention. A printed wiring board 7 is provided that supports the Hall IC 5. Other components are also shown by way of suggestion on the printed wiring board, such as a resistor 8 and a capacitor 9. They serve, for instance, to protect the Hall IC 5 from excess voltage. The printed wiring board, with its components, is accommodated in a housing 10 that is indicated by its outlines in phantom, but the interior construction of the housing, with suitable supports and guides, is not shown. The two permanent magnets 1 and 2 are also disposed in corresponding non-illustrated guides in the housing, and are preferably disposed with a press-fit in a guide channel in such a way that they can be shifted for adjustment. After the adjustment, the printed wiring board along with the permanent magnets can be firmly sealed in the housing, for instance by potting.

Figure 5:
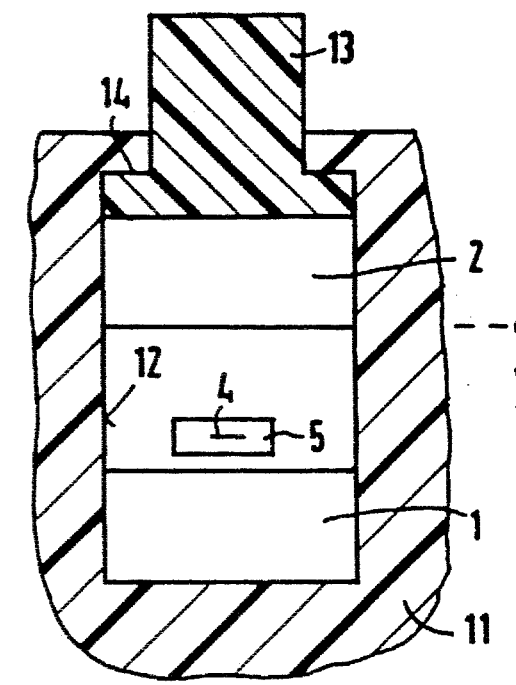
FIG. 5 is a fragmentary, sectional view of a further embodiment of a microswitch with a magnetic field sensor and a movable permanent magnet.

FIG. 5 shows another embodiment of a microswitch according to the invention. In this case, the first permanent magnet 1 with the Hall IC 5 above it is disposed fixedly in a housing 11, while the second permanent magnet 2 is axially displaceably disposed in a housing guide 12. The permanent magnet 2 is provided with a switching tappet 13 of non-ferromagnetic material, which can be actuated from outside. Since the two north poles N of the permanent magnets 1 and 2 face one another, the two magnets repel one another with a restoring force which is magnetic repulsion, and therefore in the position of repose the permanent magnet 2 rests with its switching tappet 13 against an upper housing stop 14. If the switching tappet is moved downward for actuation, then the magnetic induction at the magnetic field sensor 4 varies, which in turn can be evaluated as a switching signal.

Figure 6:
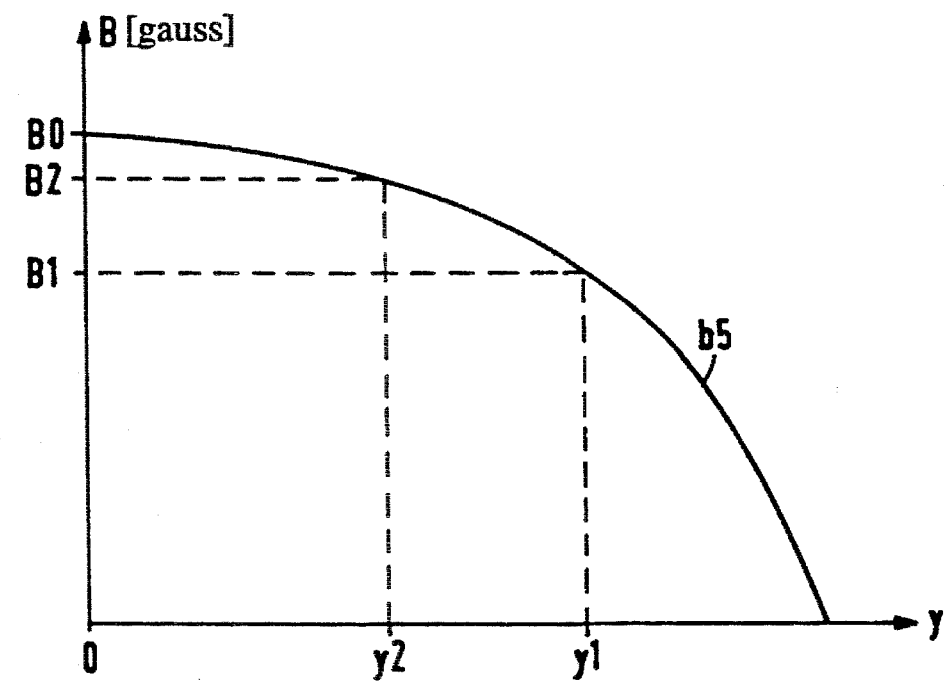
FIG. 6 is a diagram of a curve showing an exemplary course of the magnetic induction at the magnetic field sensor in a configuration according to FIG. 5.

FIG. 6 shows the course of magnetic induction in terms of an exemplary curve b5 as a function of the travel of the switching tappet in a direction y. Since the permanent magnet 2 in the position of repose is farther away from the magnetic field sensor 4 than the permanent magnet 1 is, then in the position of repose, in other words when y=0, a magnetic induction B0 is measured. During the downward motion of the switching tappet 13 and the permanent magnet 2, this magnetic induction decreases as is indicated by the curve b5, until a turn-on threshold B1 is reached, at a point y1. If the switching tappet is let go, so that the permanent magnet 2 moves upward again because of magnetic repulsion, then it reaches the turn-off threshold at a travel point y2 at an induction value B2. In this case as well, the hysteresis assures that the turn-on point and the turn-off point are a certain distance from one another, in order to assure an unequivocally defined switching condition in every instance.

Figure 7:
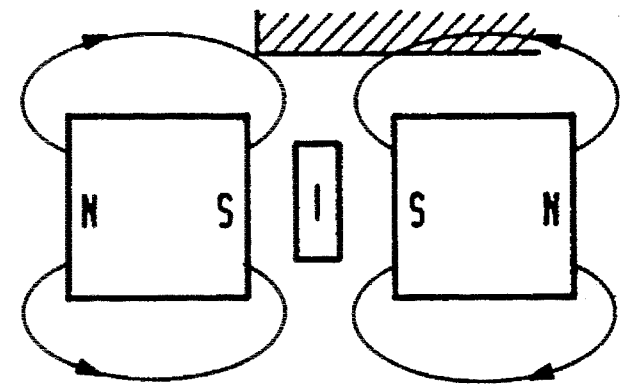
FIGS. 7–12 are fragmentary, elevational views showing the basic layout of further embodiments of a microswitch according to the invention.
Figure 8:
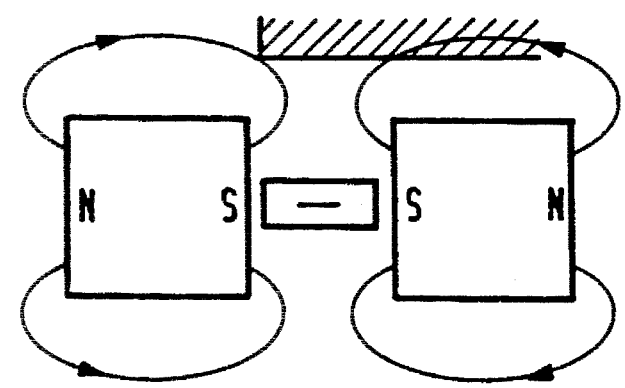
Figure 9:
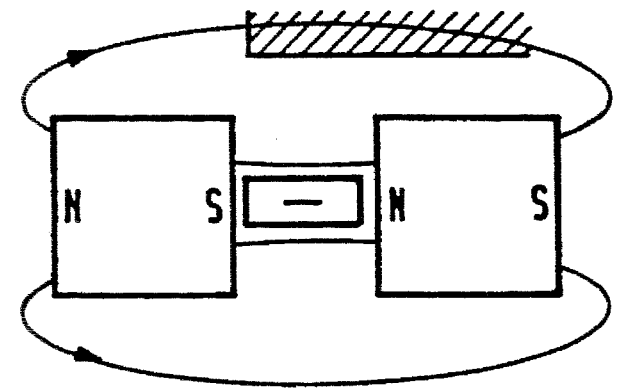

FIG. 7 diagrammatically shows a further possible configuration of a microswitch with the Hall effect. In a deviation from FIG. 1, the tripping body 6 is not moved toward one of the outer poles but rather toward a side of one of the two permanent magnets that is parallel to the axial direction. The active surface, by way of which the equilibrium of the magnetic fields is disturbed, in this case, as in the exemplary embodiments of FIGS. 8 and 9, is not located on the pole surface but rather laterally on the magnet. In FIG. 8, the chip-like magnetic field sensor 4 is disposed in the axial direction between poles of the same name or polarity of the two permanent magnets. Given this orientation of the sensor, flux lines flow through the sensor symmetrically from above and below. This equilibrium is disturbed by the approach of the tripping part 6 toward one side of one of the magnets.

FIG. 9 shows an alternative configuration, in which the sensor is disposed in the axial direction between poles that are not of the same name or polarity, and the tripping body 6 is moved toward them laterally. With this orientation, the sensor is not located in the front between two magnetic fields that are oriented opposite one another, but rather is oriented at a tangent to the lines of magnetic flux. Through the use of asymmetrical variation caused by the surrounding medium by means of the tripping body 6, the field lines are distorted, similarly to the other exemplary embodiments, and then no longer run parallel to the sensor. Only the magnetic flux component created thereby and oriented vertically with respect to the sensor is perceived by the sensor and evaluated.

The invention is not limited to a zero or near-zero flux through the sensor in the position of repose. For example, the configuration may also be chosen in such a way that in the position of repose a flux of 80 G flows through the sensor and increases upon actuation until it exceeds the switching threshold of 100 G, for instance. Conversely, depending on the application, a configuration in which the flux is initially above the switching threshold and which is drawn below the switching threshold by the approach of the tripping body may also be advantageous.

Figure 10:
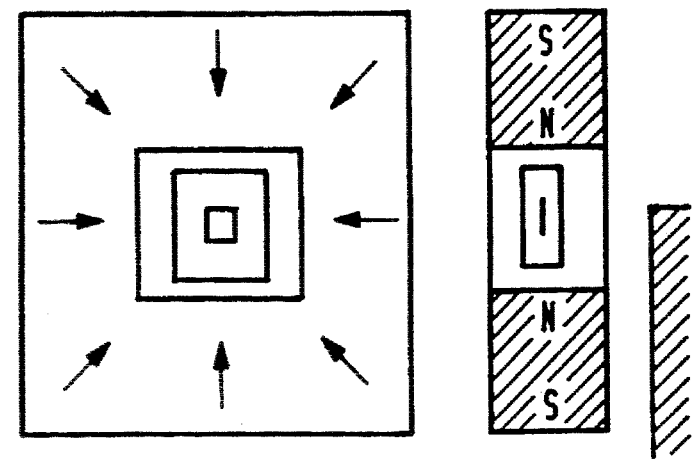
Figure 11:
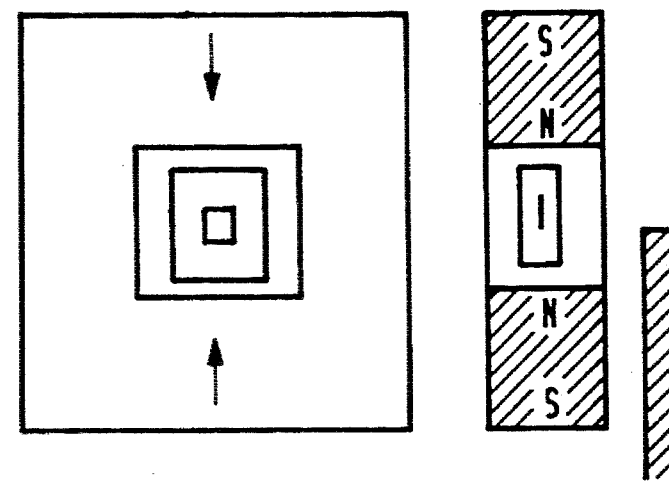
Figure 12:
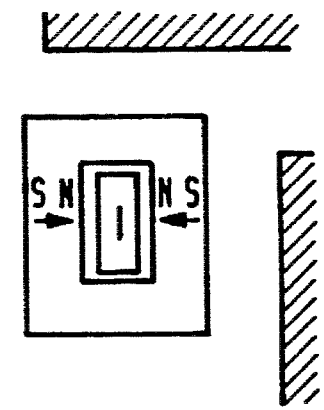

Other embodiments are shown in FIGS. 10–12. The configuration of FIG. 10 functions analogously to that of FIG. 8, except that in FIG. 10 a radially magnetized magnet is used. FIG. 11 shows a configuration like FIG. 10, but with simplified magnetization. FIG. 12 shows a configuration following the same principle as in FIGS. 10 and 11, but with only one magnet which is magnetized in two opposite directions.

The ICs used in the exemplary embodiment may have not merely one but two active regions (unipolar IC with two outputs), or may function as a latch (bipolar IC).

The terminal lugs of the magnetic field IC may be extended through the housing to the outside in various ways, for instance as is shown in FIG. 3, and may all be connected to terminals of the switch. These terminals may have any arbitrary form, and in particular may be embodied as insulation displacement connection terminals (crimp terminals) disposed on a printed wiring board or conductor strip, as is described in detail in German Patent DE 42 11 486 C.

I claim:

1. A microswitch, comprising:
   two mutually coaxial columnar permanent magnets having poles of the same polarity facing one another and other poles facing away from one another and defining an air gap therebetween, said permanent magnets generating magnetic fields defining a boundary region;
   a magnetic field sensor being disposed in the boundary region and fixedly disposed in the air gap; and
   a switch device being connected to said magnetic field sensor and having a switching status varying in accordance with magnetic induction at said magnetic field sensor.

2. A microswitch, comprising:
   two mutually coaxial columnar permanent magnets having poles of different polarities facing one another and respectively opposite poles facing away from one another and defining an air gap therebetween, said permanent magnets generating magnetic fields defining a boundary region;
   a chip-like magnetic field sensor being disposed in the boundary region and fixedly disposed in the axial direction in the air gap; and
   a switch device being connected to said magnetic field sensor and having a switching status varying in accordance with magnetic induction at said magnetic field sensor.

3. The microswitch according to claim 1, wherein said two permanent magnets are disposed at a fixed distance from one another and said magnetic field sensor in the air gap is fixed in a fixed relationship with said two permanent magnets, for adjusting the magnetic induction at said magnetic field sensor in a position of repose to a fixed value, and including a ferromagnetic tripping body for approaching a pole of one of said permanent magnets facing away from said magnetic field sensor, for assuming a magnitude of the magnetic inductance being varied as compared with the position of repose to be evaluated by said switch device.

4. The microswitch according to claim 1, wherein said two permanent magnets are disposed at a fixed distance from one another and said magnetic field sensor in the air gap is fixed in a fixed relationship with said two permanent magnets, for adjusting the magnetic induction at said magnetic field sensor in a position of repose to a fixed value, and including a ferromagnetic tripping body for approaching a side of one of said permanent magnets being parallel to the axial direction, for assuming a magnitude of the magnetic inductance being varied as compared with the position of repose to be evaluated by said switch device.

5. The microswitch according to claim 2, wherein said two permanent magnets are disposed at a fixed distance from one another and said magnetic field sensor in the air gap is fixed in a fixed relationship with said two permanent magnets, for adjusting the magnetic induction at said magnetic field sensor in a position of repose to a fixed value, and including a ferromagnetic tripping body for approaching a side of one of said permanent magnets being parallel to the axial direction, for assuming a magnitude of the magnetic inductance being varied as compared with the position of repose to be evaluated by said switch device.

6. The microswitch according to claim 1, wherein a first one of said two permanent magnets is fixed in a fixed association with said magnetic field sensor, and a second one of said two permanent magnets is guided displaceably in the axial direction and is biased by a restoring force into a position of repose remote from said magnetic field sensor, for evaluating a magnetic induction being effective at said magnetic field sensor in the position of repose, and displacement of said second permanent magnet counter to the restoring force into a working position decreasing a measured induction at said magnetic field sensor by an evaluatable amount.

7. The microswitch according to claim 6, wherein the restoring force is magnetic repulsion between said two permanent magnets.

8. The microswitch according to claim 6, including a housing, and an actuation tappet of non-ferromagnetic material being guided in said housing and connected to said second permanent magnet.

9. The microswitch according to claim 7, including a housing, and an actuation tappet of non-ferromagnetic material being guided in said housing and connected to said second permanent magnet.

10. The microswitch according to claim 1, wherein said magnetic field sensor is a Hall sensor.

11. The microswitch according to claim 2, wherein said magnetic field sensor is a Hall sensor.

12. The microswitch according to claim 1, wherein said magnetic field sensor is a magnetoresistor.

13. The microswitch according to claim 2, wherein said magnetic field sensor is a magnetoresistor.

14. The microswitch according to claim 1, including terminals being constructed as insulation displacement connection terminals.

15. The microswitch according to claim 2, including terminals being constructed as insulation displacement connection terminals.

16. A microswitch, comprising:

two mutually independent and separately disposed columnar permanent magnets each defining an axis connecting magnetic poles thereof, said two columnar permanent magnets being disposed mutually coaxially, having poles of the same polarity facing one another, and defining an air gap therebetween, said permanent magnets generating magnetic fields defining a boundary region;

a magnetic field sensor being disposed in the boundary region and fixedly disposed in the air gap; and a switch device being connected to said magnetic field sensor and having a switching status varying in accordance with magnetic induction at said magnetic field sensor.

17. A microswitch, comprising:

two mutually independent and separately disposed columnar permanent magnets each defining an axis connecting magnetic poles thereof, said two columnar permanent magnets being disposed mutually coaxially, having poles of different polarities facing one another, and defining an air gap therebetween, said permanent magnets generating magnetic fields defining a boundary region;

a chip-like magnetic field sensor being disposed in the boundary region and fixedly disposed in the axial direction in the air gap; and a switch device being connected to said magnetic field sensor and having a switching status varying in accordance with magnetic induction at said magnetic field sensor.

* * * * *